(12) United States Patent
Morse et al.

(10) Patent No.: US 8,278,741 B2
(45) Date of Patent: Oct. 2, 2012

(54) SIDEWALL PHOTODETECTOR

(75) Inventors: Michael T. Morse, San Jose, CA (US); Mario J. Paniccia, Santa Clara, CA (US); Olufemi I. Dosunmu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 455 days.

(21) Appl. No.: 12/495,665

(22) Filed: Jun. 30, 2009

(65) Prior Publication Data

US 2010/0327381 A1    Dec. 30, 2010

(51) Int. Cl.
*H01L 31/105* (2006.01)

(52) U.S. Cl. .............. 257/656; 257/E31.061; 438/65

(58) Field of Classification Search ............ 257/656, 257/E31.061
See application file for complete search history.

(56) References Cited

U.S. PATENT DOCUMENTS

| | | | |
|---|---|---|---|
| 6,365,430 B1 * | 4/2002 | Tran et al. | 438/48 |
| 6,500,692 B1 | 12/2002 | Rhodes | |
| 7,045,832 B2 * | 5/2006 | Tweet et al. | 257/184 |
| 7,880,204 B2 * | 2/2011 | Geis et al. | 257/292 |
| 2002/0097962 A1* | 7/2002 | Yoshimura et al. | 385/50 |
| 2005/0051767 A1* | 3/2005 | Leon et al. | 257/19 |
| 2005/0227402 A1 | 10/2005 | Chang et al. | |
| 2006/0141649 A1* | 6/2006 | Joyner et al. | 438/31 |
| 2006/0186503 A1 | 8/2006 | Guidotti et al. | |
| 2007/0077725 A1* | 4/2007 | Wilson et al. | 438/427 |
| 2009/0304326 A1* | 12/2009 | Blauvelt et al. | 385/14 |

FOREIGN PATENT DOCUMENTS

| | | |
|---|---|---|
| CN | 1856860 | 11/2006 |
| JP | 2003152216 | 5/2003 |

OTHER PUBLICATIONS

International Search Report and Written Opinion for Application No. PCT/US2010/034755 dated Dec. 15, 2010, 7 pgs.
International Preliminary Report on Patentability for Application No. PCTUS2010/034755 dated Jan. 4, 2012, 5 pages.
Office Action for Application No. 201010221055.7 dated Jan. 12, 2012, 10 pages.

* cited by examiner

*Primary Examiner* — Benjamin Sandvik
(74) *Attorney, Agent, or Firm* — Blakely, Sokoloff, Taylor & Zafman LLP

(57) ABSTRACT

Sidewall photodetectors for integrated photonic devices and their method of manufacture. An embodiment includes a p-i-n film stack formed on a sidewall of a substrate semiconductor feature having sufficiently large area to accommodate the spot size of a multi-mode fiber. An embodiment includes a first sidewall photodetector coupled to a second sidewall photodetector by a waveguide, the first sidewall photodetector having an i-layer tuned to absorb a first wavelength of light incident to the first sidewall and pass a second wavelength of light to the second sidewall photodetector having an i-layer tuned to absorb the second wavelength.

19 Claims, 4 Drawing Sheets

US 8,278,741 B2

SIDEWALL PHOTODETECTOR

TECHNICAL FIELD

Embodiments of the present invention are in the field of integrated optical components (IOC) and more specifically pertain to photodetectors.

BACKGROUND

Advancements in optical (photonic) components are enabling a convergence of electrical and optical device interconnections. A first generation of converged I/O modules will likely be based on 10 Gb/s 850 nm vertical cavity surface emitting lasers (VCSELs) and III-V photodetectors, but following generations are expected to move to a 1310 nm carrier wavelength division multiplexing (CWDM) configuration to achieve higher data rates, such as 40 Gb/s and 100 Gb/s, at lower cost.

To provide compatibility across generations, converged I/O receivers should ideally be able to efficiently detect both 850 nm and 1310 nm bands. Because it is expected light will be provided via multi-mode fiber for reduced packaging costs, both 850 nm and 1310 nm light will be introduced at the same point. Generally, silicon-based optical solutions are preferable over III-V technologies because silicon offers significant cost saving. However, because silicon absorbs 850 nm light, silicon-based solutions are potentially precluded from certain converged I/O applications.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

DETAILED DESCRIPTION

Figure 1:
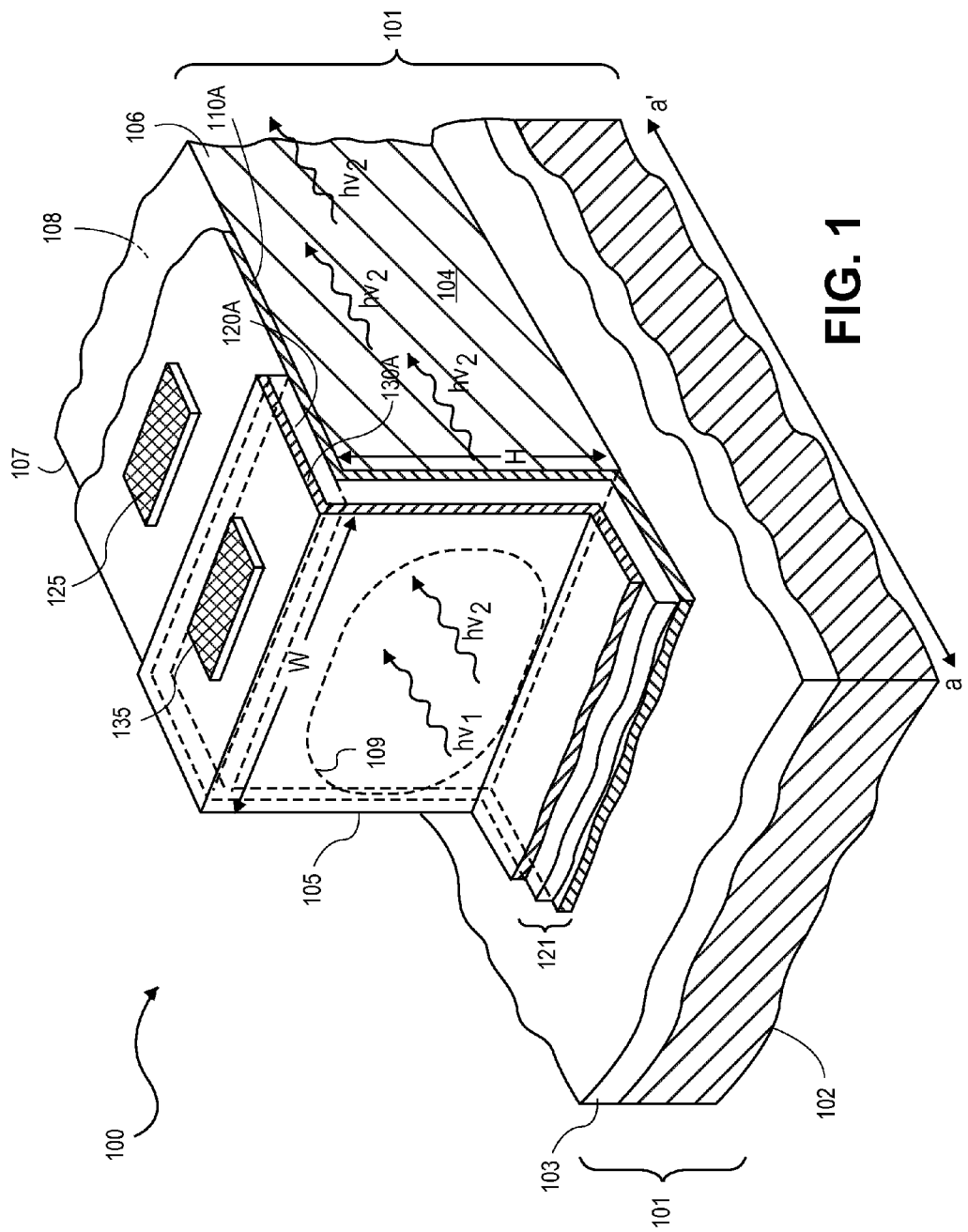
FIG. 1 illustrates an isometric view of a sidewall photodetector, in accordance with an embodiment.

Embodiments of sidewall photodetectors, their manufacture and application in integrated optical components are described herein with reference to figures. Generally, a sidewall photodetector includes a p-type and n-type film layer with an intrinsic film layer there between, the combination referred to herein as a p-i-n film stack, disposed over a sidewall of a topographic feature in a substrate. In one embodiment a germanium on silicon p-i-n sidewall photodetector is formed on a sidewall of a silicon deep trench. The active area of the sidewall photodetector is dependent on the surface area of the active sidewall, and is capable of detecting light incident to the active sidewall which is non-normal to a top surface of the substrate. In a further embodiment, a p-i-n film stack is formed on multiple sidewall surfaces to form a plurality of sidewall photodetectors. In one such embodiment, a first p-i-n film stack includes an intrinsic or "i-layer" composition tuned to provide a first sidewall photodetector with high responsivity to a first wavelength of incident radiation, such as 850 nm, while a second p-i-n film stack includes an i-layer composition tuned to provide a second sidewall photodetector with high responsivity to a second wavelength of the incident radiation, such as 1310 nm. In a particular embodiment, first and second photodetectors are coupled together via an optical waveguide such that a wavelength of light passed by the first photodetector (e.g., 1310 nm) is conducted to the second photodetector for detection, allowing separate detection of multiple wavelengths of light from a spot size incident to the first sidewall.

However, particular embodiments may be practiced without one or more of these specific details, or in combination with other known methods, materials, and apparatuses. For example, while a sidewall photodetector is described in the context of silicon-based system, sidewall photodetectors and the techniques described herein may be readily adapted to other integrated optical components, such as, but not limited to optical add/drop filters, signal conditioners, etc. In the following description, numerous specific details are set forth, such as specific materials, dimensions and material parameters etc. to provide a thorough understanding of the present invention. In other instances, well-known optical design and VLSI fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, appearances of the phrase "in an embodiment" in various places throughout this specification are not necessarily referring to the same embodiment of the invention. Furthermore, the particular features, structures, materials, or characteristics may be combined in any suitable manner in one or more embodiments. It should also be understood that specific embodiments may be combined where not mutually exclusive.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in intimate contact with that second member. Additionally, the relative position of one member with respect to other members is provided assuming operations are performed relative to a substrate common to the members without consideration of the absolute orientation of the substrate or members.

FIG. 1 depicts an isometric view of an exemplary sidewall photodetector 100. An active trench sidewall 105 is covered by an photodiode film stack, such as a p-i-n film stack 121 with a doped layer 110A, an intrinsic or i-layer 120A and a complementarily doped layer 130A disposed over portion of a topographic feature of a substrate 101. The p-i-n film stack 121 may be deposited over a topographic feature of the substrate 101 with either an n-type or a p-type layer disposed directly on the sidewall of the substrate 101 (i.e., to form a p-i-n or n-i-p stack). The thicknesses and composition of individual layers within the p-i-n film stack 121 are dependent on the substrate material selected as well as responsivity desired for a given wavelength(s). While III-V materials may be employed in certain embodiments of the present invention, in particular embodiments, the p-i-n film stack 121 includes only doped or intrinsic group IV materials. In one such embodiment, the p-i-n film stack 121 includes silicon, germanium and alloys thereof.

In an embodiment, the doped layer 110A and complementarily doped layer 130A of the p-i-n film stack each have a film thickness of less than 0.8 µm. The doped layer 110A and the complementarily doped layer 130A may be epitaxial silicon (e.g., substantially single crystalline), or an alloy thereof, doped with an appropriate n-type or p-type dopant species as known in the art. The doped layer 110A may also be a doped region of a top epitaxial layer 104 of the substrate 101. In a particular embodiment, at least one of the complementarily doped layer 130A and doped layer 110A includes at least 60 at. % silicon with a balance of germanium to form SiGe electrode semiconductor layer(s). The addition of up to about 40 at. % germanium has been found to improve the interface between an i-layer that is predominantly germanium and the p-type/n-type doped layers of the photodiode. This interface becomes smoother with the addition of germanium to the p-type/n-type layers and may also reduce the defects in the epitaxial i-layer 120A. Selectivity of the deposition of the p-i-n film stack 121 may also be affected by the introduction of germanium into the doped layer 110A, so in a particular embodiment the doped layer 110A is silicon while the complementary doped layer 130A is a silicon germanium alloy.

In the depicted embodiment, the p-i-n film stack 121 is disposed on a sidewall of a deep trench formed in the substrate 101. The sidewall photodetector 100 includes an active trench sidewall 105 defining a detector sidewall area dependent on an active trench sidewall width W and an active trench sidewall height H. Generally, the active trench sidewall 105 has an area is sufficiently large to accommodate light, incident to the active trench sidewall 105, having a spot size 109, which may be on the order of 300-700 µm$^2$ (i.e., 20-30 µm diameter) or even larger. In embodiments, the active trench sidewall 105 is substantially normal to a top surface of the substrate 101 with an active trench sidewall height H and active trench sidewall width W of between 10 and 30 µm. In a particular embodiment both the active trench sidewall height H and active trench sidewall width W is approximately 20 µm to provide a sidewall detector area of approximately 300 µm$^2$.

In the depicted embodiment, the majority of the p-i-n film stack 121 is disposed over the active trench sidewall 105 with a lesser area of the p-i-n film stack 121 disposed on non-sidewall substrate surfaces, such as on a buried insulator layer 103 or a top surface of the substrate 101. As such, the total capacitance of the sidewall photodetector 100 may be reduced for a given spot size 109. The sidewall photodetector 100 includes electrodes 125 and 135, disposed on the top surface of the substrate 101 to electrically couple the doped layer 110A and the complementarily doped layer 130A to a detection circuit. Of course, alternative embodiments having the electrodes 125 and 135 disposed over the active trench sidewall 105 and/or over portions of the p-i-n film stack 121 disposed over the insulator layer 103 are also possible.

The sidewall photodetectors described herein are generally applicable to any material system known for thin film photodetectors. For example, substrate 101 may be composed of any material suitable for integrated optical component fabrication. In one embodiment, the substrate 101 is a bulk substrate composed of a single crystal of a material which may include, but is not limited to, silicon, silicon germanium, or a III-V compound semiconductor material, such as indium phosphide (InP). In another embodiment, substrate 101 includes a bulk layer 102 with a top epitaxial layer 104 formed over the bulk layer 102. In a specific embodiment, the bulk layer 102 is composed of a single crystalline material which may include, but is not limited to, silicon or a III-V compound semiconductor material, while the top epitaxial layer 104 is composed of a single crystalline layer which may include, but is not limited to, silicon, a silicon germanium alloy, or a III-V compound semiconductor material. In another embodiment, the top epitaxial layer 104 is separated from the bulk layer 102 by the intervening insulator layer 103, such as a silicon dioxide, silicon nitride or silicon oxy-nitride layer (e.g. to form a silicon-on-insulator substrate).

In further embodiments, an interface layer (not depicted) may be disposed between the i-layer 120A and either of the doped layer 110A and the complementarily doped layer 130A. The interface layer may be a graded layer, linear or otherwise, to transition the semiconductor film composition from the i-layer 120A to either or both of the doped or complementarily doped layer. For example, where the i-layer 120A is at least 80 at. % germanium and a p-type layer and an n-type layer are substantially silicon (i.e., no more than 40 at. % Ge), an intervening interface layer may grade the Si—Ge composition from that of the doped/complementarily doped layers to that of the i-layer.

In an embodiment, the sidewall photodetector is a pass-through photodetector. As illustrated in FIG. 1, light incident to the active trench sidewall 105 includes a plurality of energies, such as $hv_1$ and $hv_2$, etc. In an embodiment, the sidewall photodetector 100 detects certain energies of light incident to the active trench sidewall 105 while passing through certain other energies of the incident light. For example, the sidewall photodetector 100 may have a high responsivity at the $hv_1$ energy band while having a low responsivity at the $hv_2$ energy band such that a significant portion of the incident $hv_2$ light passes through the p-i-n film stack 121 and into the topographic feature of the substrate 101, along the a-a' direction as illustrated. In a particular embodiment, the sidewall photodetector 100 is includes a p-i-n film stack configured for greater responsivity at 850 nm than at 1310 nm. The 850 nm light that may otherwise be absorbed by the top epitaxial layer 104 upon which the active trench sidewall 105 is formed is therefore detected prior to the light entering the top epitaxial layer 104 (i.e., incident light is detected). Light passed-through the sidewall photodetector 100, however, enters the top epitaxial layer 104 where it may be absorbed to a lesser extent (e.g., silicon or certain silicon germanium alloys absorb relatively little at 1310 nm).

In an embodiment, the sidewall photodetector 100 includes an i-layer 120A of an epitaxially grown semiconductor (e.g., having the crystallinity of the seed substrate which may be substantially single crystalline) which has a different lattice constant than that of the substrate semiconductor film. As one example, where the top epitaxial layer 104 is silicon, the i-layer 120A is an alloy of silicon and germanium (SiGe) which has a larger lattice constant (when relaxed) than the top epitaxial layer 104. The band gap of the i-layer 120A may be reduced from that of the top epitaxial layer 104 by the adjusting ratio of silicon to germanium within the thickness of the i-layer 120A and thereby increase the responsivity of the sidewall photodetector 100 to particular wavelengths of light.

The fractions of silicon and germanium may be selected based on the application. For example, in one embodiment where the i-layer 120A is to absorb at 850 nm, the silicon content of the SiGe i-layer 120A is less than about 20 at. % and may preferably be between about 10 and 15 at. %. In another embodiment where the i-layer 120A is to absorb at 1310 nm, the i-layer 120A is substantially pure germanium. The thickness of the i-layer 120A may also be selected based on application and performance requirements (e.g., responsivity, etc.) with exemplary 850 nm and 1310 nm embodiments having an i-layer 120A between approximately 1.5 µm and approximately 3.0 µm. For embodiments where the sidewall photodetector 100 is to detect a first wavelength of incident light and pass-through a second wavelength of light, the composition and thickness of the i-layer 120A may be tuned to provide a significantly higher responsivity at the first wavelength than at the second wavelength.

In an embodiment, the topographic feature over which the sidewall photodetector 100 is formed is an optical waveguide. As depicted in FIG. 1, the passive trench sidewalls 106 and 107 are non-parallel to the active trench sidewall 105 to form an optical waveguide 108. Unlike the active trench sidewall 105, the passive trench sidewalls 106 and 107 are not covered by a p-i-n film stack, but rather may be clad in a material (not depicted) which provides good index contrast, such as silicon dioxide where the optical waveguide is silicon. As such, $hv_2$ light passed through the sidewall photodetector 100 may then be conducted via the optical waveguide 108 to other regions of the substrate 101.

As illustrated, the exemplary optical waveguide 108 has a rib or ridge width approximately equal to the active trench sidewall width W and a rib height approximately equal to the active trench sidewall height H such that the sidewall photodetector 100 has an detection area approximately equal to the cross-sectional area of the optical waveguide 108. In an alternative embodiments however, the optical waveguide 108 may have a rib width unequal to the active trench sidewall width W or a rib height unequal to the active trench sidewall height H (e.g., the waveguide width or height may tapered or grated along the a-a' direction, etc.).

In an embodiment, a first and second sidewall photodetector is formed on a sidewall of an optical waveguide(s). The first and second sidewall photodetectors may be designed to detect a same wavelength. Alternatively, the first and second sidewall photodetectors may be tuned for a peak responsivity at a first and second wavelength and disposed on either different sidewalls of a same waveguide or on sidewalls of a first and second waveguide (e.g., down stream of an optical demux, etc). In one embodiment, a first sidewall photodetector disposed on a first sidewall of a waveguide is to detect a first wavelength (e.g., 850 nm) of light incident the first sidewall, pass-through a second wavelength (e.g., 1310 nm) of the incident light into the optical waveguide which is to conduct the passed-through light to a second sidewall photodetector disposed on a second sidewall of the waveguide to detect the second wavelength of light.

Figure 2:
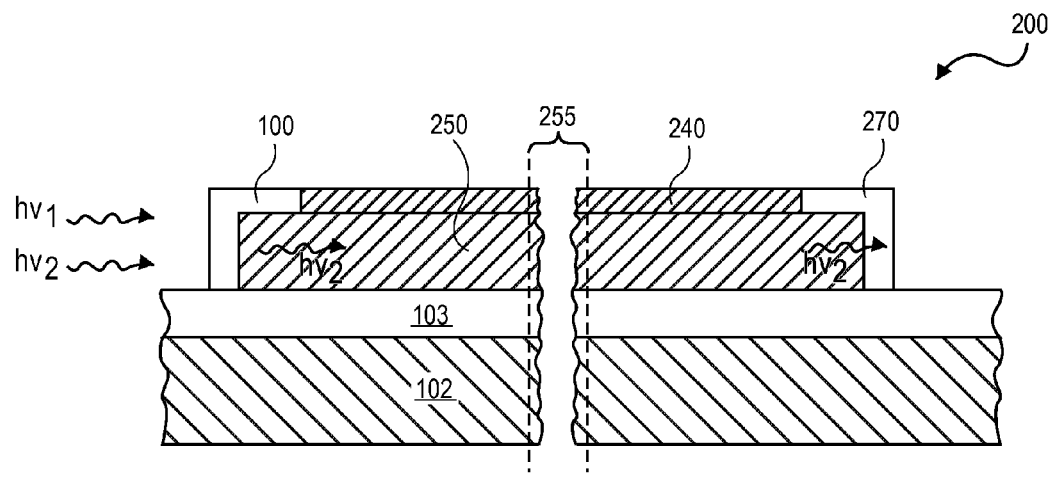
FIG. 2 illustrates a cross-sectional view of a pair of optically coupled sidewall photodetectors, in accordance with an embodiment.

FIG. 2 illustrates a cross-sectional view of a pair of optically coupled sidewall photodetectors. As shown, the sidewall photodetector 100 is disposed on a first sidewall of the optical waveguide 250 formed in the substrate substantially as described with reference to FIG. 1. A second sidewall photodetector 270 is disposed on a second sidewall of the optical waveguide 250 in a similar manner with the optical waveguide 250 spanning an arbitrary distance 255 there between. As further illustrated, the optical waveguide 250 is covered in a cladding layer 240, which may be silicon dioxide, for example, where the optical waveguide 250 is silicon or silicon germanium.

The second sidewall photodetector 270 may include a second p-i-n film stack including an i-layer having a band gap different than that of the i-layer of the sidewall photodetector 100 to absorb a light wavelength different than that of the sidewall photodetector 100. In one such embodiment, both the first and second photodetectors include germanium with the i-layer 120A having a greater silicon content than that of the i-layer in the second sidewall photodetector 270 for a lower responsivity at 1310 nm than at 850 nm while the second sidewall photodetector 270 has an epitaxial i-layer with a greater germanium concentration than that of the i-layer 120A for a relatively greater responsivity at 1310 nm. In one embodiment where the sidewall photodetector 100 is to absorb at 850 nm and the second sidewall photodetector 270 is to absorb at 1310 nm, the silicon content of a SiGe i-layer 120A is less than 20% and in one such embodiment is at least 10 at. % while a SiGe i-layer the of the second sidewall photodetector 270 has less than 10 at. % silicon and may be substantially pure germanium. In a further embodiment, the i-layer film thickness in the sidewall photodetector 100 is equal to the i-layer film thickness in the second photodetector, with each between approximately 1.5 µm and approximately 3.0 µm.

In a further embodiment, the second sidewall photodetector 270 includes a reflector (not depicted) over the p-i-n film stack to return a portion of second wavelength light over the second sidewall photodetector. Inclusion of such a reflector improves responsivity to the second wavelength while reducing the transit time of the carrier for a faster detector. Generally, the reflector may be of any type known in the art, such as, a quarter wave reflector composed of alternating layers of two or more dielectric materials deposited over the p-i-n film stack, a Bragg mirror composed of semiconductor layers grown over the p-i-n film stack, or the like. In a particular embodiment, the reflector is a metallic layer is formed over the p-i-n film stack (i.e., covering the active sidewall). In one such embodiment, the metallic reflector layer also serves as one of the electrodes 125 and 135.

Figure 3:
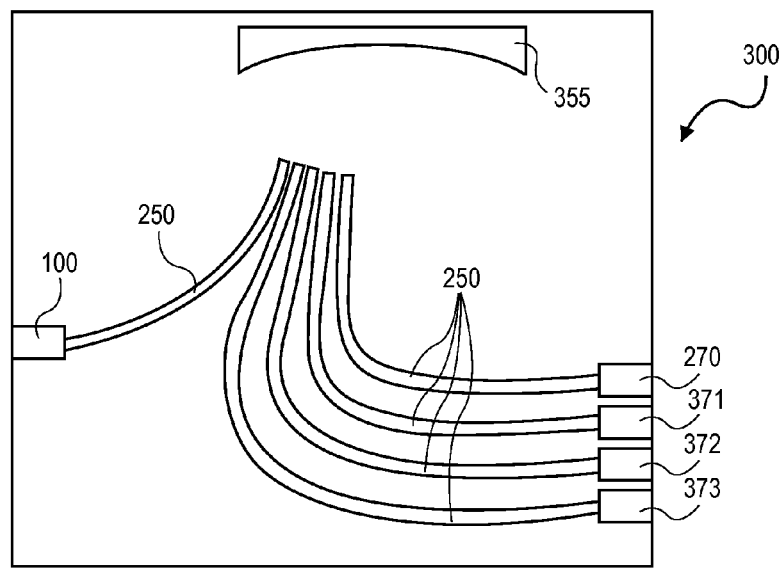
FIG. 3 illustrates a plan view of sidewall photodetectors optically coupled via an optical demultiplexer, in accordance with an embodiment.

FIG. 3 illustrates a plan view of an exemplary converged I/O chip 300 with sidewall photodetectors optically coupled via an optical demultiplexer, in accordance with an embodiment. As illustrated, the sidewall photodetector 100 is coupled to the optical waveguide 250 which conducts light that passes-through the sidewall photodetector 100 to an Echelle diffraction grating 355 to optically demultiplex light wavelengths passed by the sidewall photodetector 100. The diffracted wavelengths are then transmitted from the Echelle diffraction grating 355, via the optical waveguide 250, to the second sidewall photodetector 270 as well as the sidewall photodetectors 371, 372, 373, etc. In a particular embodiment, the sidewall photodetector 100 is configured to provide higher responsivity at a shorter nominal wavelength, such as 850 nm, while the sidewall photodetectors 270, and 31-373 are configured to provide a higher responsivity at a longer nominal wavelength, such as around 1310 nm.

As illustrated, the sidewall photodetector 100 is well suited to couple with an edge-illuminating, large area light source. In contrast to waveguide photodetector configurations typical for edge-illuminated applications, the sidewall photodetector 100 does not need a carefully designed waveguide to guide incident light. Rather, the sidewall photodetector 100 serves as a very large area horizontally orientated detector conducive to edge-illumination. In addition to reductions in optical losses, no optical spot size reduction is necessary for very high bandwidths because germanium comprising i-layers can provide high bandwidth even with a relatively large detector area (e.g., 300 µm$^2$).

FIGS. 4A, 4B, 4C and 4D illustrate cross-sectional views of intermediate structures formed during fabrication of a pair of optically coupled sidewall photodetectors, in accordance with an embodiment. FIG. 4 depicts formation of a topographic feature in a substrate. For example, the optical waveguide 250 may be formed in a layer of the substrate 101. In one embodiment, the optical waveguide 250 is formed by anisotropically etching with a plasma-based etch process, a trench with substantially vertical sidewalls into the substrate 101. In a particular embodiment, the trench terminates on an underlying stop layer, such as the insulator layer 103 at a depth defining the active trench sidewall height H. While the trench depth may therefore be on the order of 20 µm, the trench width is preferably relatively narrow to promote planar processing. For example, the trench width may be on the order of 3-5 µm. In other embodiments however, where planar processing is not desired, the trench width may be on the order of many hundreds of microns. After defining the optical waveguide 250 with the trench etch, the trench may be substantially filled with a cladding material, such as silicon dioxide or the like, using any gap fill or planarizing process know in the art.

Figure 4A:
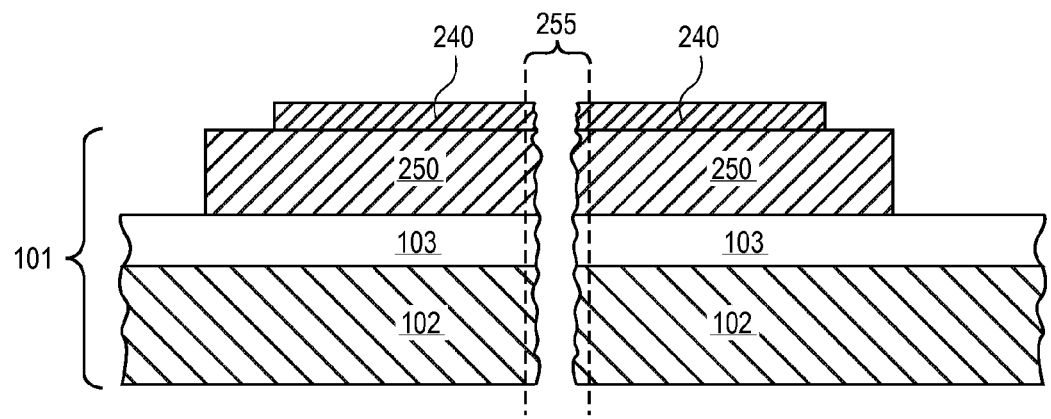
FIG. 4A illustrates a cross-sectional view of a structure formed during fabrication of a pair of optically coupled sidewall photodetectors, in accordance with an embodiment.

As further shown in FIG. 4A, active trench sidewalls upon which a sidewall detector is to be formed are not clad while non-detector sidewalls (e.g., passive trench sidewalls 106 and 107) are clad with the cladding layer 240. Selective cladding may be achieve by removing the cladding layer 240 using any patterning and etching technique known in the art, for example, or by forming a first trench defining passive sidewalls which are to be subsequently cladded (e.g., the passive trench sidewalls 106 and 107), depositing a cladding, and then defining an active sidewall which is not to be cladded (e.g., the active trench sidewall 105) after the passive sidewalls are clad.

Figure 4B:
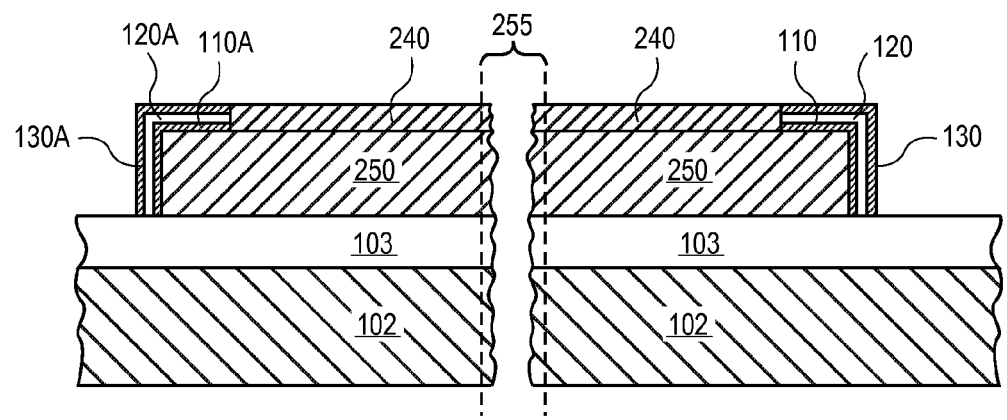
FIG. 4B illustrates a cross-sectional view of a structure formed during fabrication of a pair of optically coupled sidewall photodetectors, in accordance with an embodiment.

As shown in FIG. 4B, the doped layer 110A is formed on the active trench sidewall (i.e., active sidewall of the optical waveguide 250) as part of a p-i-n film stack. In one such embodiment, the doped layer 110A comprises silicon or a silicon germanium alloy epitaxially grown on an active sidewall of the waveguide 250. As further depicted, a second doped layer 110 is also formed on a second active sidewall of the optical waveguide 250. In one such embodiment, both the doped layer 110A and the second doped layer 110 are epitaxially grown simultaneously to a same thickness and composition.

Following formation of the doped layer 110A, the i-layer 120A may be epitaxially grown on the doped layer 110A. In particular embodiments where the doped layer 110A and substrate are predominantly silicon, the i-layer 120A is grown to sufficient thickness using at least a germanium source, reducing the band gap of the i-layer relative to that of the substrate to provide the optical characteristics described elsewhere herein. As further depicted in FIG. 4B, a second i-layer 120 is also formed on the second doped layer 110. In one such embodiment, both the i-layer 120A and the second i-layer 120 are epitaxially grown simultaneously to a same thickness and composition. The complementarily doped layers 130A and 130 may then be formed with a final epitaxial growth to achieve the compositions described elsewhere herein and complete the p-i-n film stacks for a first and second photodetector.

In an embodiment, at least one of the i-layer 120A and second i-layer 120 is implanted with a species to modify the optical properties of the p-i-n film stack as grown. In one embodiment where the i-layer is to be predominantly germanium, a germanium epitaxial layer is implanted with silicon to modify the optical properties of the i-layer (e.g., tuning the responsivity of the sidewall photodetector 100). In alternative embodiments, a silicon i-layer is implanted with germanium to modify the optical properties of the i-layer. Tuning detector optical properties with an implant is particularly advantageous because a single epitaxial process may be used to form both the i-layer 120A and the second i-layer 120 and no sacrificial layers need to be deposited and stripped off. After simultaneous formation of both i-layers 120A and 120, the optical properties of one of the i-layer 120A or the second i-layer 120 may then be modified selectively through the use of either a masked implant or a high angle implant.

Figure 4C:
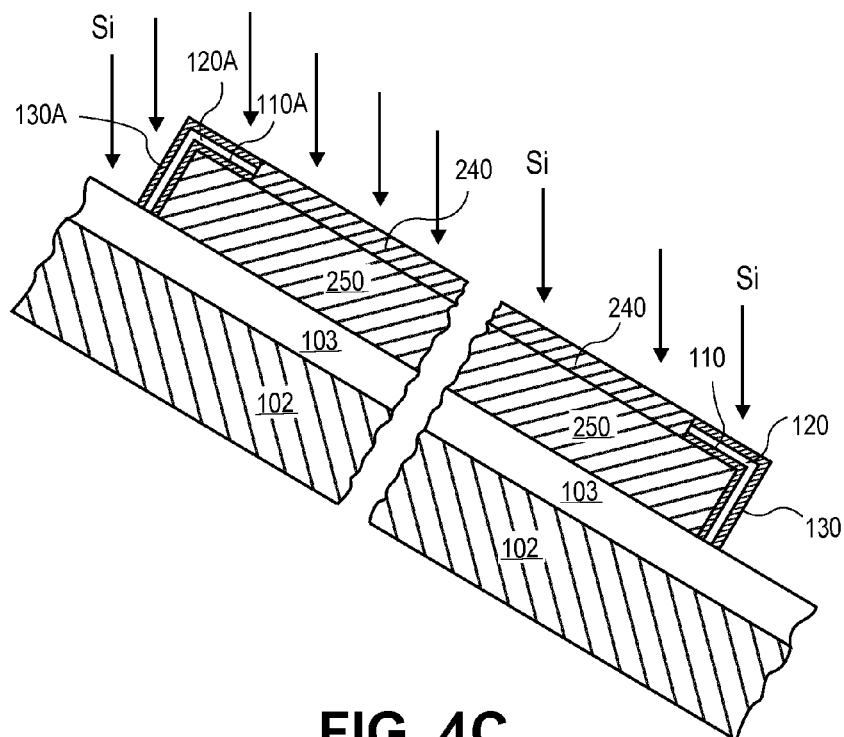
FIG. 4C a cross-sectional view of a structure formed during fabrication of a pair of optically coupled sidewall photodetectors, in accordance with an embodiment.

FIG. 4C further depicts an advantageous high angle implant embodiment where the substrate is tilted at approximately 50-60 degrees so that the i-layer 120A receives the implant species flux while the second i-layer 120 is protected from the implant flux by the shadow of the optical waveguide 250. Although in the exemplary embodiment, the i-layer implant is performed after the formation of the complementarily doped layer 130A and/or 130, the i-layer implant may also be prior to the formation of the complementarily doped layer. Depending on the active trench sidewall height H, the deep trench at the end of the optical waveguide 250 that is to receive the implant species may need to be significantly wider than a trench defining a non-detector sidewall (e.g., passive trench sidewalls 106 and 107) which is filled with cladding. For example, in an embodiment where the active trench sidewall height H is on the order of 20 to 30 µm, the deep trench defining the active trench sidewall 105 has a width dimension (as measure along a directional vector normal to the active trench sidewall 105) on the order of 100 µm to permit implantation of substantially the entire active trench sidewall.

In one embodiment employing a germanium epitaxial i-layer 120A and a germanium epitaxial second i-layer 120, silicon is implanted at a high angle into the i-layer 120A to reach at least 10 at. % silicon for a lower responsivity at 1310 nm than at 850 nm. The second i-layer 120, shadowed by the optical waveguide 250 during the high angle silicon implant, remains nearly pure germanium, as grown, and therefore retains a high responsivity at 1310 nm. Alternative embodiments where germanium is implanted into a silicon i-layer while a second silicon i-layer is shadowed are also possible although it may be more difficult to implant germanium and a relatively larger dose of germanium may be required to tune the responsivity for acceptable performance (e.g., in excess of 30 at. %).

Following the optical property tuning implant, a thermal anneal activates the implant species to modify the optical properties the first i-layer semiconductor film relative to the second i-layer semiconductor film. In one such embodiment an anneal at a temperature range of between 600 and 850° C. is performed to increase the 1310 nm transmissivity of the sidewall photodetector 100 to a level significantly above that of the second sidewall photodetector 270. During the anneal, some diffusion of silicon and germanium can be expected in both the i-layer 120A and the second i-layer 120. However, the silicon concentration profile in the i-layer 120A will be indicative of an implantation. For example, the silicon concentration profile may be a non-linear function of the film thickness of the i-layer 120A. In contrast, the as-deposited germanium of the second i-layer 120, which was shadowed from the silicon implant, will merely have an increased concentration of silicon at the interfaces of the i-layer 120 (e.g., diffusional intermixing) with the majority of the i-layer thickness remaining substantially pure germanium.

Figure 4D:
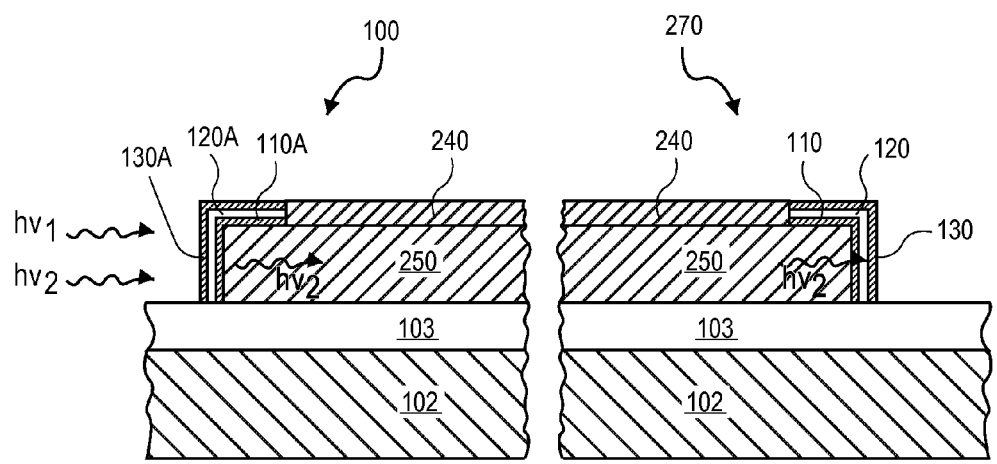
FIG. 4D illustrates a cross-sectional view of a structure formed during fabrication of a pair of optically coupled sidewall photodetectors, in accordance with an embodiment.

Upon completing the structure depicted in FIG. 4D with conventional fabrication techniques, for example to couple electrodes (not depicted) to the p-i-n film stacks of the sidewall photodetectors 100 and 270, the optically coupled sidewall photodetector device is functional to detect multiple wavelengths of light (e.g., $hv_1$ and $hv_1$).

Thus, a sidewall photodetector, method of manufacture and application in optical component integration has been disclosed. Although the present invention has been described in language specific to structural features or methodological acts, it is to be understood that the invention defined in the appended claims is not necessarily limited to the specific features or acts described. The specific features and acts disclosed are to be understood merely as particularly graceful implementations of the claimed invention provided in an effort to illustrate rather than limit the present invention.

What is claimed is:

1. A photonic device, comprising:
    a substrate semiconductor film with first and second trench sidewalls formed therein;
    a first photodetector including a first p-i-n film stack disposed over the first trench sidewall, wherein the first p-i-n film stack comprises a first i-layer semiconductor film having a band gap to absorb at least a portion of light incident to the first trench sidewall having a first wavelength and to pass at least a portion of the incident light having a second wavelength;
    a second photodetector including a second p-i-n film stack disposed over the second trench sidewall, wherein the second p-i-n film stack comprises a second i-layer semiconductor film having a band gap different than that of the first i-layer semiconductor film to absorb at least a portion of light having the second wavelength; and
    an optical waveguide formed in the substrate semiconductor film and spanning at least a portion of a distance between the first and the second photodetectors to optically couple to the second sidewall photodetector at least a portion of the incident light including the second wavelength passed by the first sidewall photodetector.

2. The photonic device as in claim 1, wherein the first i-layer semiconductor has a different lattice constant than that of the substrate semiconductor film.

3. The photonic device as in claim 2, wherein the first i-layer semiconductor film has a narrower band gap than the substrate semiconductor film and wherein second light wavelength is greater than the first.

4. The photonic device as in claim 3, wherein the substrate semiconductor film comprises predominantly silicon lattice atoms and wherein the first i-layer semiconductor film comprises a silicon germanium alloy with at least 10 at. % silicon.

5. The photonic device as in claim 2, wherein the photodetector area on the trench sidewall is at least 300 μm² and film thickness of the first i-layer semiconductor film is between approximately 1.5 μm and approximately 3.0 μm.

6. The photonic device as in claim 1, wherein the substrate semiconductor film is substantially silicon, the first i-layer semiconductor film comprises a silicon germanium alloy having a greater silicon content than does the second i-layer semiconductor film, and wherein the first i-layer semiconductor film has substantially the same film thickness as the second i-layer semiconductor film.

7. The photonic device as in claim 6, wherein the silicon concentration profile in the first i-layer semiconductor is a non-linear function of the first i-layer semiconductor film thickness and wherein the second i-layer semiconductor is substantially pure germanium.

8. The photonic device as in claim 1, further comprising a reflector layer over the second p-i-n film stack to reflect the second light wavelength back to the second p-i-n film stack.

9. A system comprising:
    the photonic device as in claim 1; and
    an optical demux optically coupled downstream of the first sidewall photodetector.

10. A method of forming a photonic device, the method comprising:
    etching a substrate semiconductor film to form an optical waveguide in the substrate semiconductor film having a substantially vertical first trench sidewall optically coupled by the waveguide to a second trench sidewall;
    forming a first p-i-n film stack over the first trench sidewall, wherein the first p-i-n film stack comprises a first i-layer semiconductor film having a band gap to absorb at least a portion of light having a first wavelength incident to the first trench sidewall and to pass at least a portion of the incident light having a second wavelength into the optical waveguide;
    forming a first pair of electrodes coupled to a p-type and a n-type layer of the first p-i-n film stack to form a first photodetector having a majority of a detector area on the first trench sidewall;
    forming a second p-i-n film stack over the second trench sidewall and forming a second pair of electrodes coupled to the second p-i-n film stack to form a second photodetector on the second trench sidewall, wherein the second p-i-n film stack comprises a second i-layer semiconductor film having a band gap different than that of the first i-layer semiconductor film to absorb at least a portion of light having the second wavelength transmitted from the first p-i-n film stack by the optical waveguide.

11. The method as in claim 10, wherein forming the first p-i-n film stack further comprises:
    forming a first doped semiconductor layer of a first conductivity type over the first trench sidewall;
    epitaxially growing a first i-layer semiconductor film on the doped semiconductor layer, the first i-layer semiconductor film having a different lattice constant than that of the substrate semiconductor film; and
    forming a second doped semiconductor layer of a second conductivity type, complementary to the first, over the first i-layer semiconductor film.

12. The method as in claim 10,
    wherein the forming of the second p-i-n film stack includes epitaxially growing a second i-layer semiconductor over the second trench sidewall.

13. The method as in claim 12 wherein forming the second p-i-n stack further comprises:
    forming the first doped semiconductor layer over the second trench sidewall at substantially the same time the first doped semiconductor layer is formed on the first trench sidewall; and
    epitaxially growing the second i-layer semiconductor on the first doped semiconductor layer at substantially the same time the first i-layer semiconductor film is epitaxially grown.

14. The method as in claim 12, wherein forming the first p-i-n stack further comprises:
    performing a high angle implant with the first trench sidewall exposed to the implant species flux to implant a species into the first i-layer semiconductor film while the second trench sidewall is shadowed from the implant species flux to prevent implantation of the species into the second i-layer semiconductor film.

15. The method as in claim 14, further comprising performing a thermal anneal activating the implant species to modify the band gap of the first i-layer semiconductor film relative to the second i-layer semiconductor film.

16. The method as in claim 13, wherein forming the first doped layer further comprises:
    epitaxially growing a silicon germanium alloy having a graded or constant silicon concentration that is at least 60 at. %.

17. A photonic device, comprising:
    an optical waveguide comprising a crystalline semiconductor;
    a first photodetector disposed at a first end of the optical waveguide, wherein the first photodetector includes a first p-i-n film stack disposed over a first sidewall the waveguide, wherein the first p-i-n film stack comprises a first i-layer semiconductor film having a band gap to absorb at least a portion of light incident to the first sidewall having a first wavelength and to pass at least a portion of the incident light having a second wavelength into the waveguide; and
    a second sidewall photodetector disposed at a second end of the waveguide, wherein the second photodetector includes a second p-i-n film stack disposed over a second sidewall of the waveguide, wherein the second p-i-n film stack comprises a second i-layer semiconductor film having a band gap different than that of the first i-layer semiconductor film to absorb at least a portion of light having the second wavelength transmitted from the first photodetector by the waveguide.

18. The photonic device of claim 17, wherein the semiconductor is substantially silicon, the first i-layer semiconductor film comprises a silicon germanium alloy having a greater silicon content than does the second i-layer semiconductor film.

19. The photonic device as in claim 18, wherein a silicon concentration profile in the first i-layer semiconductor is a non-linear function of the first i-layer semiconductor film thickness and wherein the second i-layer semiconductor is substantially pure germanium.

* * * * *

UNITED STATES PATENT AND TRADEMARK OFFICE
CERTIFICATE OF CORRECTION

| | | |
|---|---|---|
| PATENT NO. | : 8,278,741 B2 | Page 1 of 1 |
| APPLICATION NO. | : 12/495665 | |
| DATED | : October 2, 2012 | |
| INVENTOR(S) | : Morse et al. | |

It is certified that error appears in the above-identified patent and that said Letters Patent is hereby corrected as shown below:

Please insert in column 1, line 3 before TECHNICAL FIELD:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*